United States Patent
Ware et al.

(10) Patent No.: US 11,456,025 B2
(45) Date of Patent: Sep. 27, 2022

(54) HYBRID MEMORY MODULE

(71) Applicant: Rambus Inc., San Jose, CA (US)

(72) Inventors: Frederick A. Ware, Los Altos Hills, CA (US); John Eric Linstadt, Palo Alto, CA (US); Kenneth L. Wright, Sunnyvale, CA (US)

(73) Assignee: Rambus Inc., San Jose, CA (US)

( * ) Notice: Subject to any disclaimer, the term of this patent is extended or adjusted under 35 U.S.C. 154(b) by 8 days.

(21) Appl. No.: 17/089,899

(22) Filed: Nov. 5, 2020

(65) Prior Publication Data

US 2021/0118480 A1 Apr. 22, 2021

Related U.S. Application Data

(63) Continuation of application No. 16/344,321, filed as application No. PCT/US2017/055908 on Oct. 10, 2017, now Pat. No. 10,847,196.
(Continued)

(51) Int. Cl.
*G06F 12/08* (2016.01)
*G11C 11/00* (2006.01)
(Continued)

(52) U.S. Cl.
CPC ........ *G11C 11/005* (2013.01); *G06F 12/0246* (2013.01); *G06F 12/0804* (2013.01); *G06F 12/084* (2013.01); *G06F 12/0895* (2013.01); *G11C 5/04* (2013.01); *G11C 14/0018* (2013.01); *G06F 2212/1016* (2013.01); *G06F 2212/1041* (2013.01); *G06F 2212/1044* (2013.01); *G06F 2212/305* (2013.01); *G06F 2212/7202* (2013.01); *G06F 2212/7205* (2013.01); *G11C 7/22* (2013.01); *G11C 11/4076* (2013.01); *G11C 2207/2245* (2013.01)

(58) Field of Classification Search
None
See application file for complete search history.

(56) References Cited

U.S. PATENT DOCUMENTS

| | | |
|---|---|---|
| 5,630,097 A | 5/1997 | Orbits et al. |
| 5,893,152 A | 4/1999 | Fuller et al. |
| (Continued) | | |

FOREIGN PATENT DOCUMENTS

| | | |
|---|---|---|
| WO | WO-2008-057557 A2 | 5/2008 |
| WO | WO-2012-087471 A2 | 6/2012 |

OTHER PUBLICATIONS

EP Communication Pursuant to Rule 164(1) EPC dated Jun. 3, 2020 re: EP Appln. No. 17865589.0. 13 Pages.
(Continued)

*Primary Examiner* — Kevin Verbrugge
(74) *Attorney, Agent, or Firm* — Silicon Edge Law Group LLP; Arthur J. Behiel

(57) ABSTRACT

A memory module includes cache of relatively fast and durable dynamic, random-access memory (DRAM) in service of a larger amount of relatively slow and wear-sensitive nonvolatile memory. Local controller manages communication between the DRAM cache and nonvolatile memory to accommodate disparate access granularities, reduce the requisite number of memory transactions, and minimize the flow of data external to nonvolatile memory components.

20 Claims, 15 Drawing Sheets

Related U.S. Application Data

(60) Provisional application No. 62/415,143, filed on Oct. 31, 2016.

(51) Int. Cl.
*G06F 12/0804* (2016.01)
*G06F 12/084* (2016.01)
*G06F 12/0895* (2016.01)
*G11C 5/04* (2006.01)
*G11C 14/00* (2006.01)
*G06F 12/02* (2006.01)
*G11C 11/4076* (2006.01)
*G11C 7/22* (2006.01)

(56) References Cited

U.S. PATENT DOCUMENTS

| | | |
|---|---|---|
| 5,933,844 A | 8/1999 | Young |
| 5,996,055 A | 11/1999 | Woodman |
| 6,000,006 A | 12/1999 | Bruce et al. |
| 6,029,224 A | 2/2000 | Asthana et al. |
| 6,442,666 B1 | 8/2002 | Stracovsky |
| 6,772,315 B1 | 8/2004 | Perego |
| 6,801,994 B2 | 10/2004 | Beckert et al. |
| 7,269,708 B2 | 9/2007 | Ware |
| 7,757,045 B2 | 7/2010 | Shannon et al. |
| 8,554,982 B2 | 10/2013 | Nishihara et al. |
| 8,694,716 B2 | 4/2014 | Bildgen et al. |
| 8,745,315 B2 | 6/2014 | Ware et al. |
| 8,760,936 B1 | 6/2014 | Rajan et al. |
| 9,378,142 B2 | 6/2016 | Ramanujan et al. |
| 2008/0114930 A1 | 5/2008 | Sanvido et al. |
| 2010/0077136 A1* | 3/2010 | Ware ............... G06F 12/0246 711/103 |
| 2010/0217915 A1 | 8/2010 | O'Connor et al. |
| 2010/0293420 A1 | 11/2010 | Kapil et al. |
| 2010/0332727 A1 | 12/2010 | Kapil et al. |
| 2011/0055458 A1 | 3/2011 | Kuehne |
| 2012/0124277 A1 | 5/2012 | Danilak et al. |
| 2012/0151119 A1 | 6/2012 | Yoshida et al. |
| 2013/0086309 A1 | 4/2013 | Lee et al. |
| 2014/0281193 A1 | 9/2014 | Schaefer |
| 2015/0106545 A1 | 4/2015 | Godard et al. |
| 2015/0143034 A1 | 5/2015 | Chinnaswamy et al. |
| 2015/0149692 A1* | 5/2015 | Wang ............... G06F 3/06 711/103 |
| 2015/0302904 A1 | 10/2015 | Yoon et al. |
| 2015/0363107 A1 | 12/2015 | Best et al. |
| 2016/0267027 A1 | 9/2016 | Fujisawa et al. |
| 2017/0024326 A1* | 1/2017 | Luo ............... G06F 12/123 |
| 2017/0364264 A1* | 12/2017 | Ioannou ............... G06F 3/0652 |

OTHER PUBLICATIONS

Notification Concerning Transmittal of International Preliminary Report on Patentability dated May 9, 2019 re: Int'l Appln. No. PCT/US2017/055908. 7 Pages.

Notification of Transmittal of the International Search Report and the Written Opinion of the International Searching Authority, or the Declaration dated Feb. 13, 2018 re: Int'l Appln. No. PCT/US17/055908. 10 Pages.

\* cited by examiner

HYBRID MEMORY MODULE

FIELD OF THE INVENTION

The disclosed embodiments relate generally to memory systems, components, and methods.

BRIEF DESCRIPTION OF THE DRAWINGS

The detailed description is illustrated by way of example, and not by way of limitation, in the figures of the accompanying drawings and in which like reference numerals refer to similar elements and in which.

DETAILED DESCRIPTION

A memory module includes a cache of relatively fast, durable, and expensive dynamic, random-access memory (DRAM) in service of a larger amount of relatively slow, wear-sensitive, and inexpensive flash memory. A local controller on the memory module manages communication between the DRAM cache and flash memory to accommodate disparate access granularities, reduce the requisite number of memory transactions, and minimize the flow of data external to flash memory components. The memory module thus combines the nonvolatility and reduced per-bit price of flash memory with the speed and durability of DRAM.

Figure 1A:
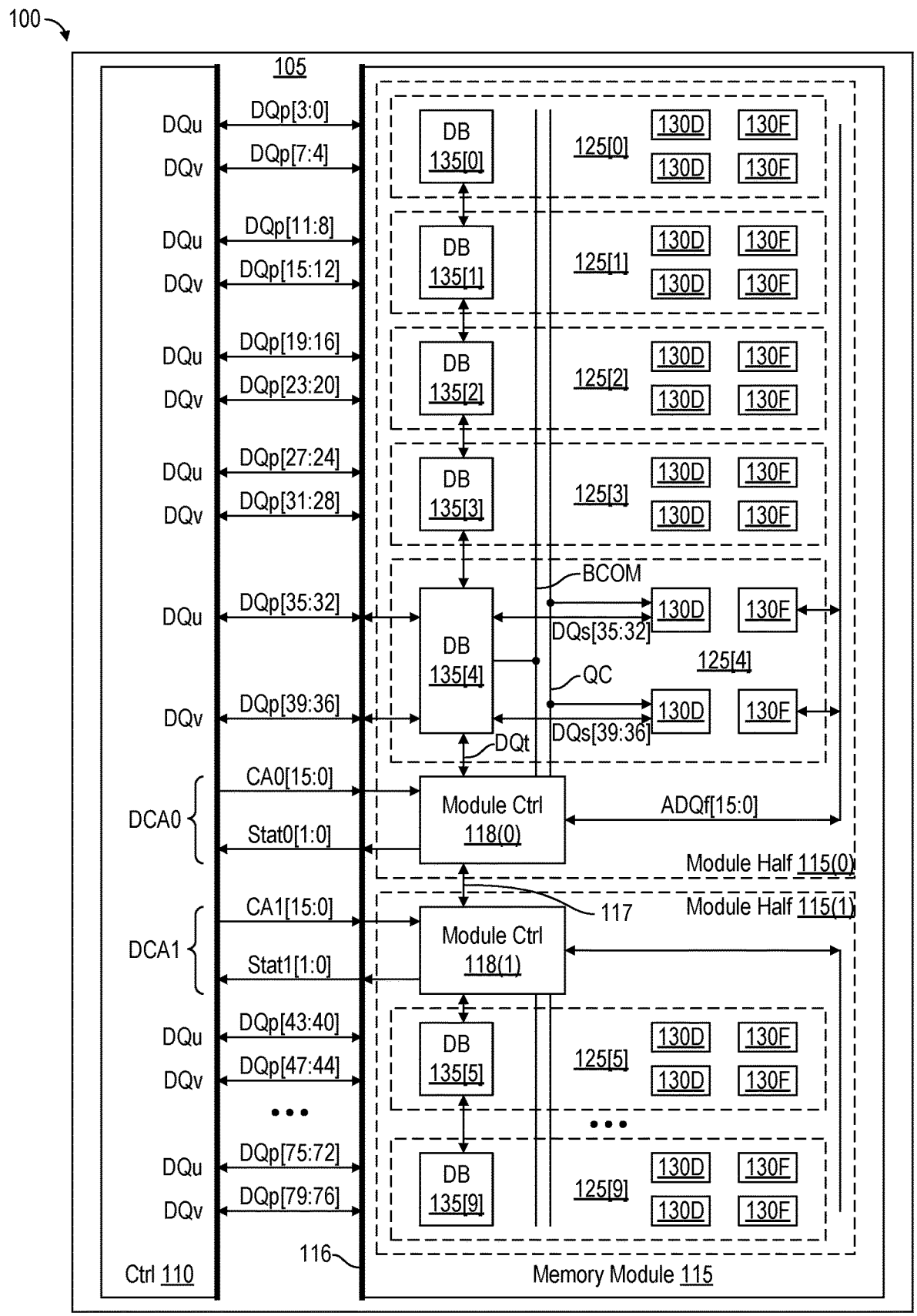
FIG. 1A depicts a memory system 100 in which a motherboard 105 supports a memory controller 110 that communicates with a memory module 115 via twenty pairs of nibble-wide (four-bit, or ×4) primary data ports DQu/DQv and two primary command-and-address (CA) ports DCA0 and DCA1.

FIG. 1A depicts a memory system 100 in which a motherboard 105 supports a memory controller 110 that communicates with a memory module 115 via twenty pairs of nibble-wide (four-bit, or ×4) primary data ports DQu/DQv and two primary command-and-address (CA) ports DCA0 and DCA1. Memory module 115 is logically divided into two module halves 115(0) and 115(1) that can be controlled separately or together to communicate either forty-bit or eighty-bit data over a module connector 116. Halves 115(0) and 115(1) are identical for purposes of this disclosure; the following discussion focusses on low-order module half 115(0). Links 117 between halves 115(0) and 115(1) allow both to respond to the same commands in the eighty-bit mode.

Module 115 supports DRAM caches that hasten read and write access and reduce wear for a larger amount of nonvolatile memory. Module half 115(0) includes a local module controller 118(0), sometimes referred to as a register or registering clock driver (RCD), an integrated-circuit component that manages five memory slices 125[4:0] at the direction of external controller 110. Each slice 125[4:0] includes two flash memory components 130F, two DRAM components 130D, and a data-buffer (DB) component 135. DRAM components 130D collectively have e.g. one one-sixteenth (1/16) the storage capacity of flash components 130F. Among other tasks, each DB component 135 works with a module controller 118 to manage the flow of data between DRAM components 130D of the same slice and flash components 130F from the same or different slices. The following discussion focuses on memory slice 125[4], the slice in module half 115(0) closest to module controller 118(0). The remaining slices 125[3:0] are essentially identical. DRAM and flash memories can be arranged differently in other embodiments. Where DRAM components 130D are organized in slices, for example, it could be that flash components are separate from all or a subset of these slices. For example, only every other slice with one or more DRAM component might also include flash memory.

Module controller 118(0) receives commands from external controller 110 via links CA0[15:0] and returns status information via links Stat0[1:0]. Module controller 118(0) also controls: DB components 135[4:0] via a local communication bus BCOM; DRAM components 130D via a DRAM control bus QC; and flash components 130F via a flash data and control bus ADQf. In one embodiment, bus ADQf conforms to an interface specification known as ONFI, for "Open NAND Flash Interface." Other embodiments can use different interfaces and different types of volatile and nonvolatile memory.

Remaining focused on slice 125[4], DB component 135[4] communicates with controller 110 via eight primary data links DQp[39:32] and with DRAM components 130D via a corresponding eight secondary data links DQs[39:32]. Read and write memory accesses are accomplished in sixteen-bit bursts, so DB component 135[4] communicates 128 bits (4×2×16b=128b) for each memory access, and the five slices 125[4:0] of module half 115(0) communicate a cumulative 640 bits (5×128b=640b) with external controller 110. Using ten-bit bytes, module half 115(0) thus exhibits an access granularity of sixty-four bytes (64B). DRAM components 130D are collectively employed as cache memory, and the 64B data sets transferred between DRAM components 130D memory and either controller 110 or flash components 130F are termed "cache lines."

External controller 110 issues read commands that request information from specific addresses in flash components 130F. If a requested address is cached in DRAM components 130D, then module controller 118(0) manages the delivery of that cache line from a rank of ten DRAM components 130D dies via five DB components 135[4:0]. In this context, a "rank" refers to a set of components that module controller 118(0) accesses (read or write) responsive to a host-side memory request. Each DRAM component 130D has a data width of four bits, so module half 115(0) has a rank width of forty bits.

If the requested data is not in cache—a so-called cache miss—module controller 118(0) reads the requested data from a cache-line address of one or more of flash components 130F via local bus ADQf and distributes the resultant flash cache line evenly across all ten DRAM components 130D of module half 115(0). A local bi-directional or paired unidirectional daisy-chain data bus DQt provides point-to-point connections between module controller 118(0) and each slice 125[4:0]. Caching a subset of each cache line in each DRAM component 130D supports parallel, high-speed read and write access for host controller 110. Storing complete flash cache lines in individual flash components 130F facilitates fast and efficient cache write-back and garbage-collection processes.

Figure 1B:
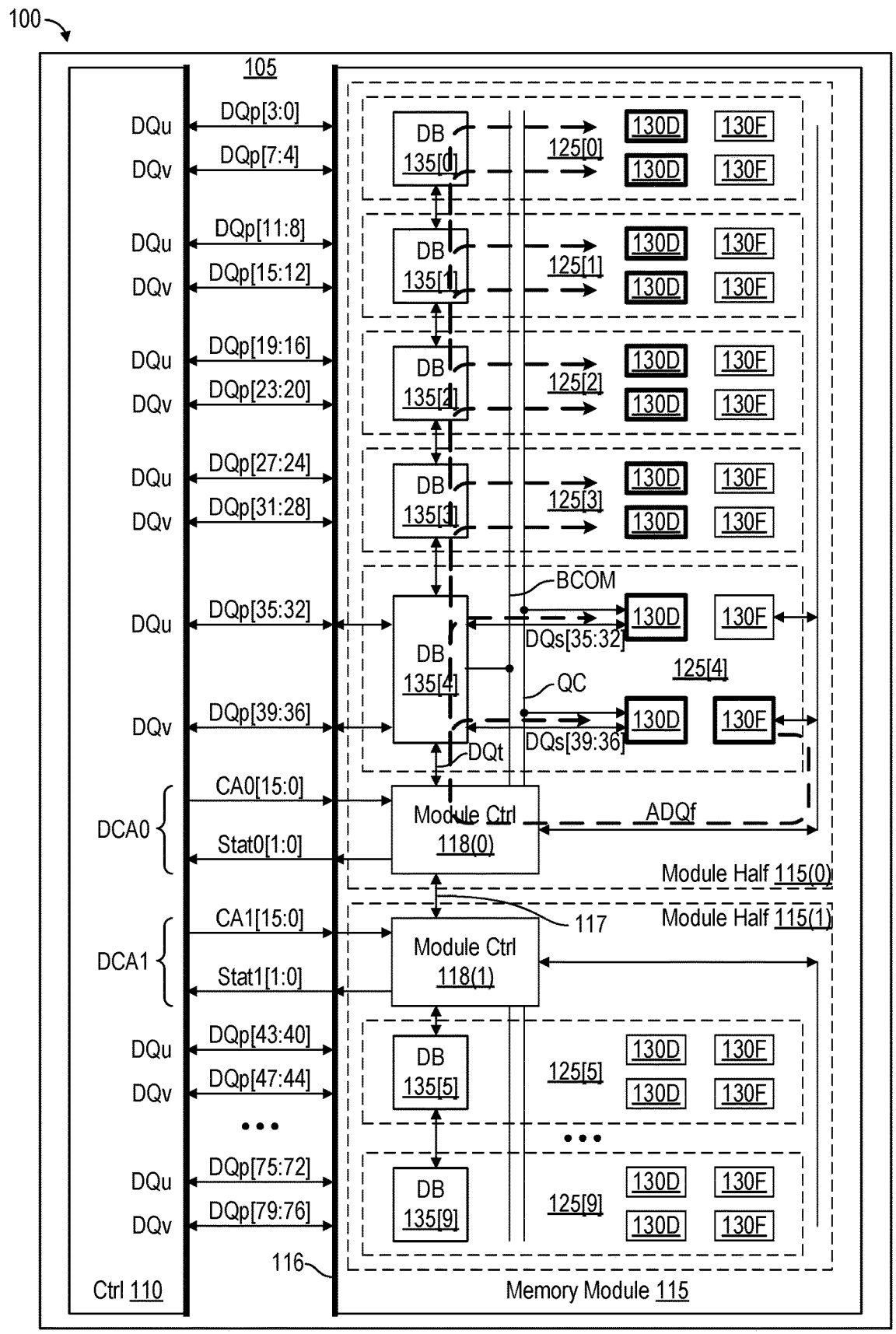
FIG. 1B depicts memory system 100 of FIG. 1A, but includes bold, dashed arrows to illustrate how a 64B cache line of data is distributed from a single flash component 130F—highlighted using bold boundaries—to a rank of ten similarly highlighted DRAM components 130D.

FIG. 1B depicts memory system 100 of FIG. 1A, but includes bold, dashed arrows to illustrate how a 64B cache line of data is distributed from a single flash component 130F—highlighted using bold boundaries—to a rank of ten similarly highlighted DRAM components 130D. In a wide mode, module 115 supports ranks of twenty DRAM components 130D; links 117 between module controllers 118(0) and 118(1) allow cache lines from one or more flash components 130F to be distributed across all twenty DRAM components 130D.

Figure 2:
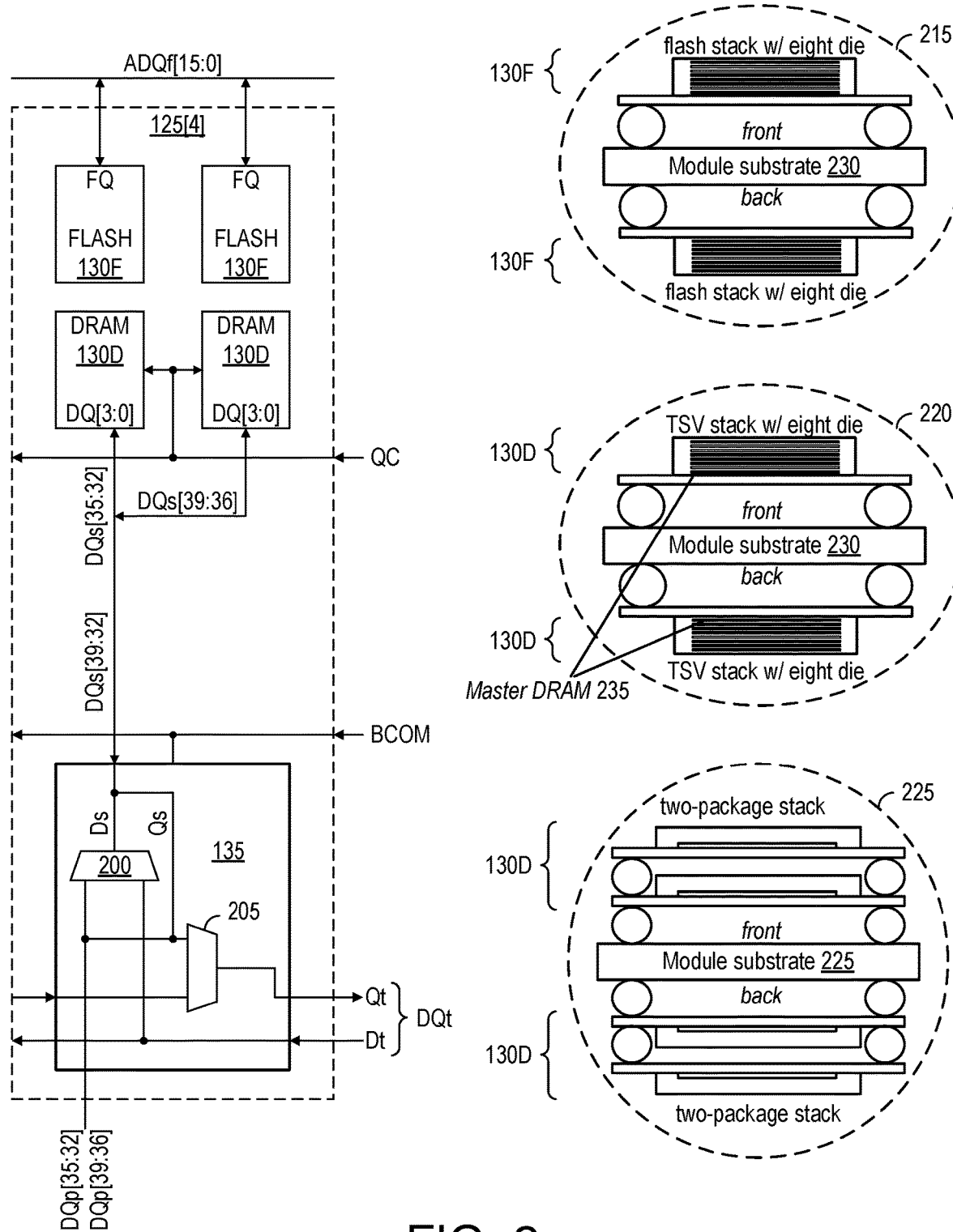
FIG. 2 depicts memory slice 125[4] of FIGS. 1A and 1B in accordance with one embodiment.

FIG. 2 depicts memory slice 125[4] of FIGS. 1A and 1B in accordance with one embodiment. Each of DRAM components 130D includes a DRAM-component interface DQ[3:0] supporting a four-bit data width (the "volatile data width") connected to data-buffer component 135 via a respective one of the two secondary data link groups DQs [35:32] and DQs[39:36]. Each of flash components 130F includes a flash-component interface FQ connected to module controller 118(0) (FIGS. 1A and 1B) via multi-drop bus ADQf[15:0]. Component interfaces FQ and bus ADQf each support a sixteen-bit data width (the "nonvolatile data width"). Steering logic 200 and 205 allow DRAM components 130D to communicate data with controller 110, via primary data links DQp[39:32], or with flash components 130F via local bus DQt. Steering logic 205 and links DQt through DB component 135 additionally allow slice 125[4] to communicate data between module controller 118(0) and neighboring slices 125[3:0]. This functionality is detailed below in connection with FIG. 3.

FIG. 2 additionally shows a packaging option 215 for flash components 130F and alternative packaging options 220 and 225 for DRAM components 130D. Flash packaging option 215 includes two stacks of eight flash devices, or "dies," interconnected by e.g. through-silicon vias (TSVs). Flash components 130F are on either side of module substrate 230 in this example. DRAM packaging option 220 includes two stacks of eight DRAM dies interconnected by e.g. TSVs. Module controller 118(0) thus selects a rank of DRAM dies, one from each DRAM component 130D, for each memory access. Each DRAM stack includes a master die 235 with data-buffer logic. In packaging option 225, DRAM components 130D are two-package stacks, one package on either side of module substrate 230. DRAM components 130D serve as cache storage for up to e.g. one sixteenth of the storage space afforded by flash components 130F. Other alternative arrangements with the same or different numbers of DRAM or nonvolatile memory dies or packages can also be used.

Figure 3:
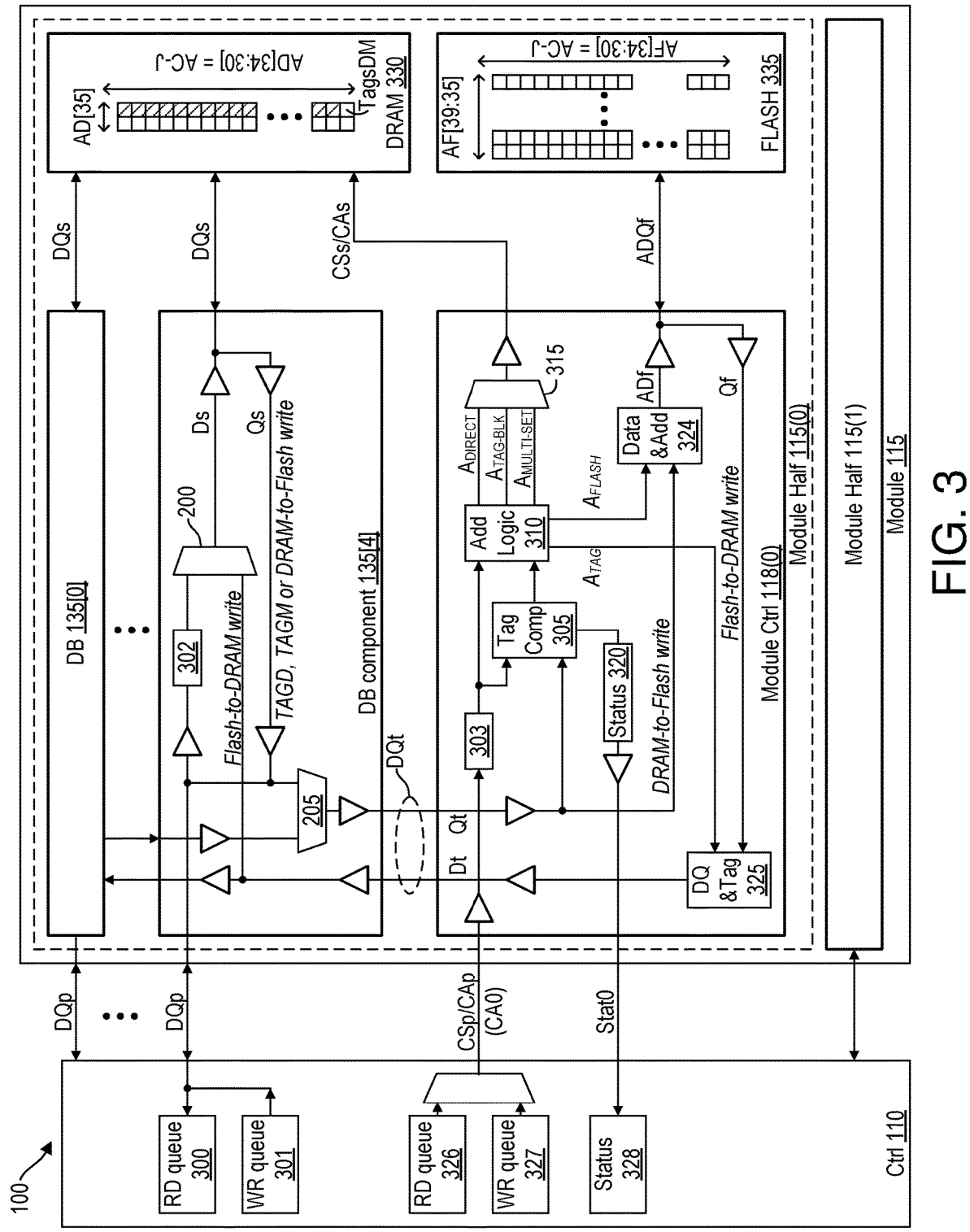
FIG. 3 depicts memory system 100 of FIG. 1 in a manner that emphasizes functional aspects of low-order module half 115(0).

FIG. 3 depicts memory system 100 of FIG. 1 in a manner that emphasizes functional aspects of low-order module half 115(0). DB component 135[4] and module controller 118(0) include numerous triangles suggestive of buffers and included to highlight the directions of information flow. Selection and placement of signal buffers, and the routing of signals in general, is within the skill of those in the art. Each DB component 135 communicates with memory controller 110 via eight primary data links DQp, delivering read data to a read queue 300 and receiving write data from a write queue 301 into a data buffer 302. Queues 300 and 301 and the other elements of controller 110 are conventional, so a detailed discussion is omitted.

Module controller 118(0) includes a buffer 303, tag-comparison logic 305, address mapping logic 310, a command/address multiplexer 315, status logic 320, data/address selection logic 324, and a tag block 325. Module controller 118(0) receives commands and addresses from read and write queues 326 and 327 of controller 110, and passes status information back to a status register 328 in controller 110.

The ten DRAM components 130D of module half 115(0) that were introduced in connection with FIG. 1 are depicted collectively as DRAM address space 330. DRAM address bit AD[35] distinguishes between caches of different associativities and latencies. Module controller 118(0) sets address bit AD[35] to zero to access a relatively fast direct cache of thirty-two 64B cache lines (white), and to one to access a relatively slower multi-set cache of thirty-one 64B cache lines (shaded). A special cache line entry TagsDM does not cache flash data, but instead stores a cache tag and dirty bit for every direct and multi-set cache entry. The ten flash components 130F of module half 115(0) are depicted collectively as an array of 64B flash cache lines (white squares) in flash address space 335. Flash address space 335 stores sixteen times as many cache lines as DRAM space 330 so flash addresses are specified using four more bits than DRAM address space 330 (AF[39:30] vs. AD[35:30]).

Any 64B cache line in flash space 335 can have a corresponding entry in the direct cache of DRAM address space 330 provided the flash address bits AF[34:30] match the corresponding DRAM address bits AD[34:30]. The multi-set cache does not have the same limitation on the lower-order address bits; any 64B cache line in flash address space 335 can have a corresponding entry in any of the thirty-one multi-set cache lines (shaded squares) of DRAM address space 330. Relative to the direct cache, this multi-set flexibility improves the cache hit rate but increases cache latency.

Figure 4:
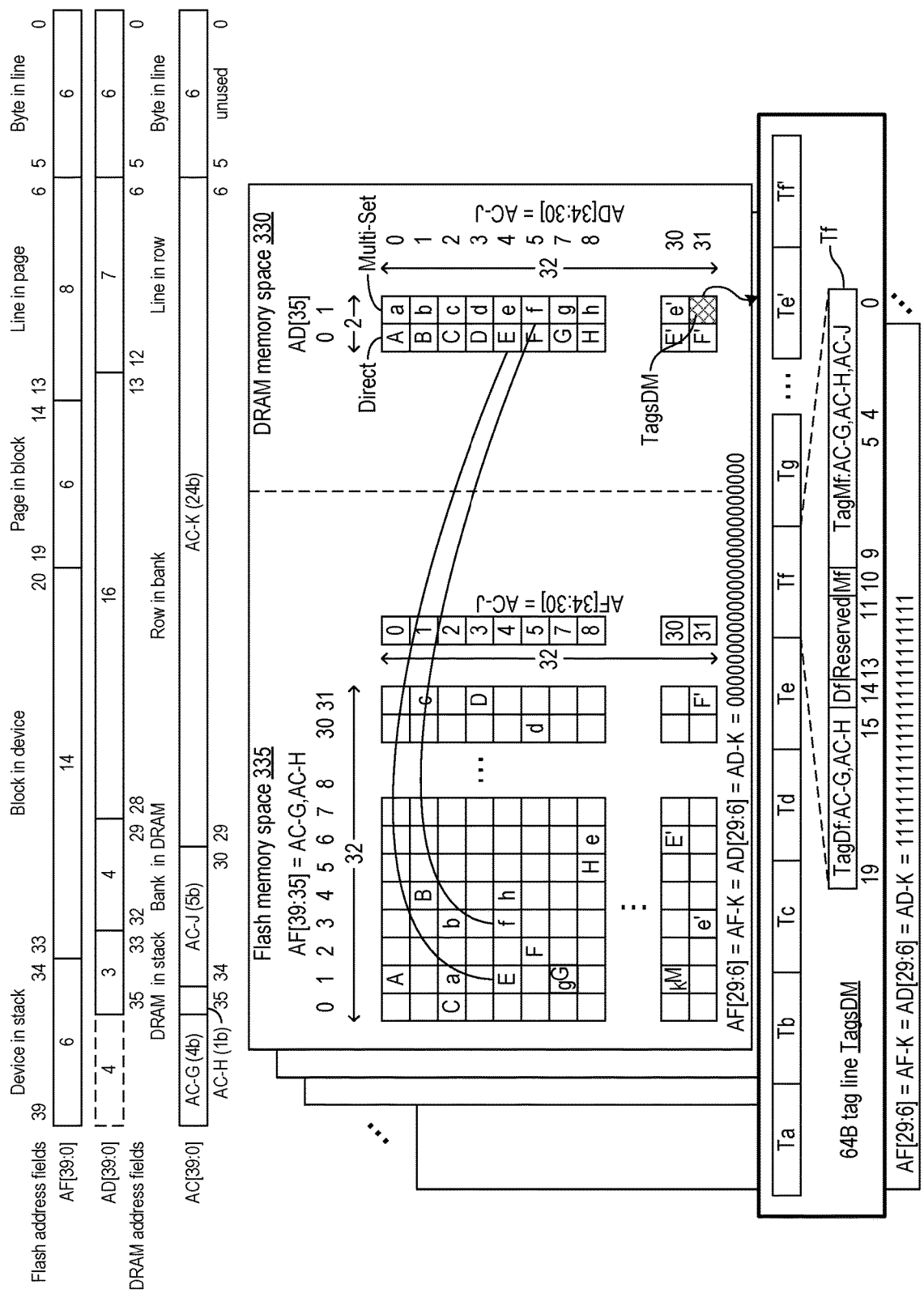
FIG. 4 illustrates how 64B cache lines in flash memory space 335 of FIG. 3 map to 64B cache lines in DRAM memory space 330 in accordance with one embodiment.

FIG. 4 illustrates how 64B cache lines in flash memory space 335 of FIG. 3 map to 64B cache lines in DRAM memory space 330 in accordance with one embodiment. The top of the page depicts the address fields for flash addresses AF[39:0], DRAM addresses AD[35:0], and controller addresses AC[39:0] in accordance with one embodiment. The flash addressing accommodates up to 64 ($2^6$) flash devices in a stack, with each device having 16K ($2^{14}$) erase blocks. Each erase block, in turn, includes 64 pages, each with 256 ($2^8$) 64B cache lines. The six byte-address bits are not used. The DRAM addressing accommodates up to eight ($2^3$) DRAM devices in a stack, with each device having sixteen ($2^4$) banks. Each DRAM bank, in turn, includes 64K ($2^{16}$) rows, each with 128 ($2^7$) 64B cache lines.

Turning to the lower portion of FIG. 4, flash memory space 335 is divided into 16M ($2^{24}$) logical slices specified by flash address bits AF[29:6]. Each logical slice includes thirty-two rows and thirty-two columns of 64B cache lines, the rows and columns respectively specified using flash address bits AF[39:30]. DRAM memory space 330 is divided into the same number ($2^{24}$) of logical slices as is flash memory space 335, with each DRAM slice specified by DRAM address bits AD[29:6]. However, each DRAM slice includes one-sixteenth the cache lines in flash. In particular, each DRAM slice includes thirty-two rows and two columns of 64B cache lines, the rows and columns respectively specified using DRAM address bits AD[35:30]. The left column of 32 DRAM cache lines (AD[35]=0) is used as a direct cache for the corresponding flash slice, whereas the right column (AD[35]=1) is used as a multi-set cache.

Considering first the direct cache, entries of which are illustrated using capital letters, any cache line in a given row of flash entries can be cached in the direct DRAM entry for the corresponding row. Flash cache line E in row four (AF[34:30]=00100), for example, maps to the direct DRAM entry at row four (AD[34:30]=00100). Any other flash cache line in flash row four can likewise be mapped to the direct entry at DRAM row four. Though not shown, each cache line in the direct cache additionally stores a cache tag to sub-specify the flash column of the DRAM cache entry. Cache line E, for example, would be stored in the DRAM direct cache with a direct tag TagD=00001 to identify flash column one (AF[39:35]=00001). Read accesses directed to a given cache line read this tag with the corresponding cache line and use the tag to quickly determine whether the retrieved cache line is the sought-after data. Numerically, DRAM memory space 330 includes one direct cache line for thirty-two flash cache lines. However, the likelihood of a given access finding the data in the direct DRAM cache—a direct-cache "hit"—is considerably greater than one in thirty-two due to the principle of cache locality.

Multi-set cache-line entries are illustrated using lower-case letters. Any of the 1,024 (32×32) 64B cache-line entries in the flash slice (addresses AF[39:30], flash memory space 335) can be cached in any of thirty-one multi-set DRAM entries (address AD[35]=1, DRAM memory space 330). For example, flash line f in flash row four (AF[34:30]=00100) maps to the multi-set entry at DRAM row five (AD[34:30]= 00101), but could map to any of the thirty-one multi-set entries. Some flash lines may be cached in both the direct and the multi-set caches in this embodiment, as indicated using the entries g/G and k/M.

Cache line TagsDM, stored at DRAM address AD [35:30]=11111, is a 64B (640b) cache line divided into thirty-two 20b tag entries Ta through Tf, one for each of the thirty-two cache rows in DRAM memory space 330. Each of tag entries Ta through Tf includes five fields, as illustrated for tag entry Tf (row five, or AD[34:30]=00101). From right to left, the ten low-order bits Tf[9:0] specify a multi-set tag for the corresponding cache row five; the eleventh bit Tf[10] is a multi-set dirty bit Mf indicating whether the contents of the multi-set entry in row five is dirty; bits Tf[13:11] are reserved; the fifteenth bit Tf[14] is a direct dirty bit Df indicating whether the contents of the direct entry in row five is dirty; and the five high-order bits Tf[19:15] specify a direct tag for the corresponding cache row five. Each of the remaining tag entries is similar, with the exception that the last tag entry Tf lacks multi-set dirty-bit and cache-tag fields; bits Tf[13:0] are reserved. The direct tag in each tag entry is redundant with the similar direct tag stored with the corresponding cache line and used to detect direct read hits. As detailed below, including redundant direct tags with the multi-set tags and dirty bits at a common address allows module controller 118(0) to minimize data transfers during write backs.

Figure 5:
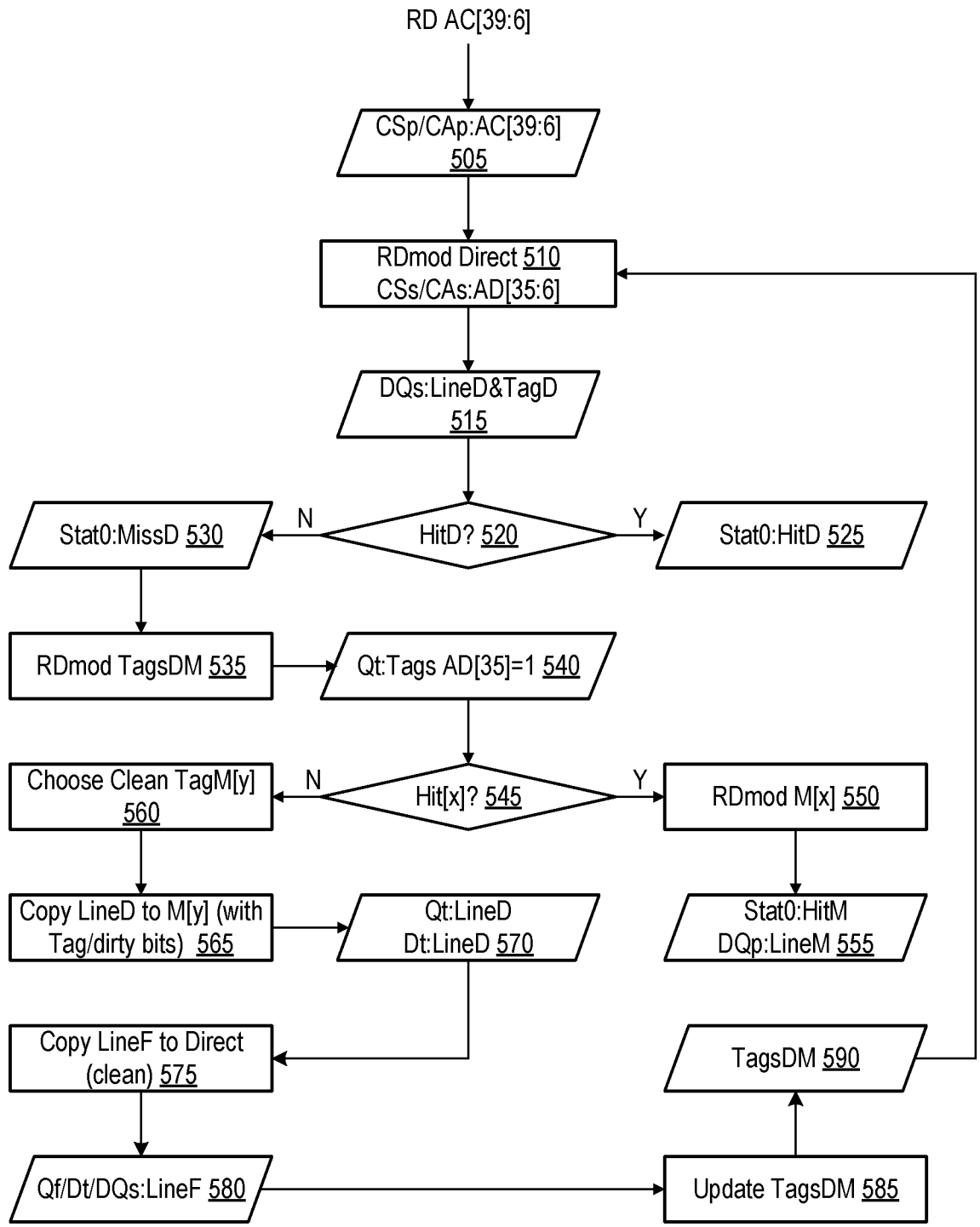
FIG. 5 is a flowchart 500 illustrating a read access to module half 115(0), and refers to signals and signal lines introduced in FIG. 3.

FIG. 5 is a flowchart 500 illustrating a read access to module half 115(0), and refers to signals and signal lines introduced in FIG. 3. In general, signals and their associated nodes carry the same designations. Whether a given moniker refers to a signal or a corresponding node will be clear from the context.

A read transaction begins when external controller 110 issues a read request over primary links CSp/CAp specifying a controller address AC[39:6] (505). Module controller 118(0), using multiplexer 315, directs a portion of this address over secondary links CSs/CAs to DRAM memory space 330 as a direct address $A_{DIRECT}$ specifying DRAM address AD[35:6] (510). DRAM memory space 330 responsively delivers the addressed direct-cache data LineD and corresponding five-bit direct tag TagD over secondary data links DQs (515). Data LineD is sent to controller 110 via primary links DQp and direct tag TagD is stripped off and conveyed via local links Qt to tag-comparison logic 305. If the tag TagD matches address bits AC[39:36], then the cache line LineD read from DRAM memory space 330 is the sought-after data; this condition is referred to as a direct cache hit (520). Module controller 118(0) responsively instructs status logic 320 to issue a direct-hit signal HitD to status register 328 (525) to let controller 110 know that the delivered read data LineD is the requested data. Thus ends the read transaction.

If the attempted access to the direct cache is a miss, then module controller 118(0) issues a direct-miss signal MissD to status register 328 (530) so that controller 110 ignores the delivered data LineD and attempts to find the requested cache line entry in the multi-set cache. Module controller 118(0) retains data LineD in DB components 135[4:0] in buffers 302 so that LineD can be written to the multi-set cache and its DRAM cache line overwritten by a new flash cache line should the multi-set cache also result in a miss.

To access the multi-set cache, module controller 118(0) directs a read request with the address $A_{TAG-BLK}$ of cache line TagsDM of DRAM address space 330 via multiplexer 315 (535). The 64B cache line TagsDM is conveyed from all five DB components 135[4:0] to tag-comparison logic 305 via links Qt (540). As noted above in connection with FIG. 4, cache line TagsDM includes a multi-set tag TagM[a-f] for each of thirty-one multi-set cache-line entries T[a-f']. Tag-comparison logic 305 compares multi-set tags TagM[a-f'] with address bits AC[39:30] to determine which, if any, multi-set cache line includes the requested data (545). For a multi-set cache hit to a multi-set cache line TagM[x], module controller 118(0) issues a read request to the multi-set address $A_{MULTI-SET}$ associated with the identified cache line TagM[x] (550). DB components 135[4:0] convey the requested data to controller 110 and module controller 118(0) conveys a multi-set hit signal HitM from status register 320 (555) to let controller 110 know that the new set of read data is the requested data. This ends a read transaction that results in a multi-set hit.

A multi-set hit returns requested data using three successive DRAM accesses (read the direct cache, read the multiset tags of cache line TagsDM, and read the multi-set cache line identified as a "hit"). The read latency for multi-set hits is thus about three times the read latency of direct-cache hits. This speed penalty is offset by the increased likelihood of a cache hit provided by the multi-set mapping flexibility. The impact on memory bandwidth can be minimized by interleaving the three memory accesses with other cache accesses.

The worst case, from a read-latency perspective, is a multi-set miss at decision 545. In that case module controller 118(0) chooses a clean entry TagM[y] in multi-set cache (560). This selection is facilitated by the inclusion of the multi-set dirty bits in cache line TagsDM, which was read from DRAM in support of decision 545 and can therefore be considered without another DRAM access. If none of the multi-set entries is clean, then module controller 118(0) performs a cache write-back, a process that is detailed below in accordance with one embodiment, to obtain a clean multi-set cache line. Assuming a clean multi-set cache line TagM[y] is available, the data LineD read from the requested direct cache line, which module controller 118(0) retained in DB components 135[4:0], is copied to the clean multi-set location TagM[y] (565).

Module controller 118(0) then reads the requested data LineF from flash address space 335, conveys data LineF to DB components 135[4:0], and writes data LineF and direct tag TagD to the direct-cache address specified by the original read request from controller 110 (575 and 580). To accomplish this data and tag transfer to DRAM, module controller 118(0) derives a flash address $A_{FLASH}$ from the original read request and uses this address to initiate a flash read operation. A 64B cache line is conveyed to module controller 118(0) via links ADQf. Tag block 325 combines data tag $A_{TAG}$ from address logic 310 with the associated 64B cache line on flash data bus Qf. Module controller 118(0), via data bus DQt and DB components 135[4:0], conveys the 64B cacheline to controller 110 and writes both the tag and cacheline to DRAM address space 330. Module controller 118(0) also updates the value of cache line TagsDM to reflect the new direct tag for data LineF and the new multi-set tag for data LineD. In one embodiment, address logic 310 combines the tags and dirty bits from read request of 535 with the new direct and multi-set tags and corresponding direct and multi-set dirty-bits and passes this information to tag block 325 for delivery to DRAM address space 330 via DB components 135[4:0] (585 and 590). The process then returns to 510 where module controller 118(0) requests the updated cache line in the direct cache for delivery to controller 110. Alternatively, LineF can be delivered to controller 110 and the DRAM cache concurrently, or the process can end at 590 to await a subsequent request from controller 110, which this time will result in a direct-cache hit.

Figure 6:
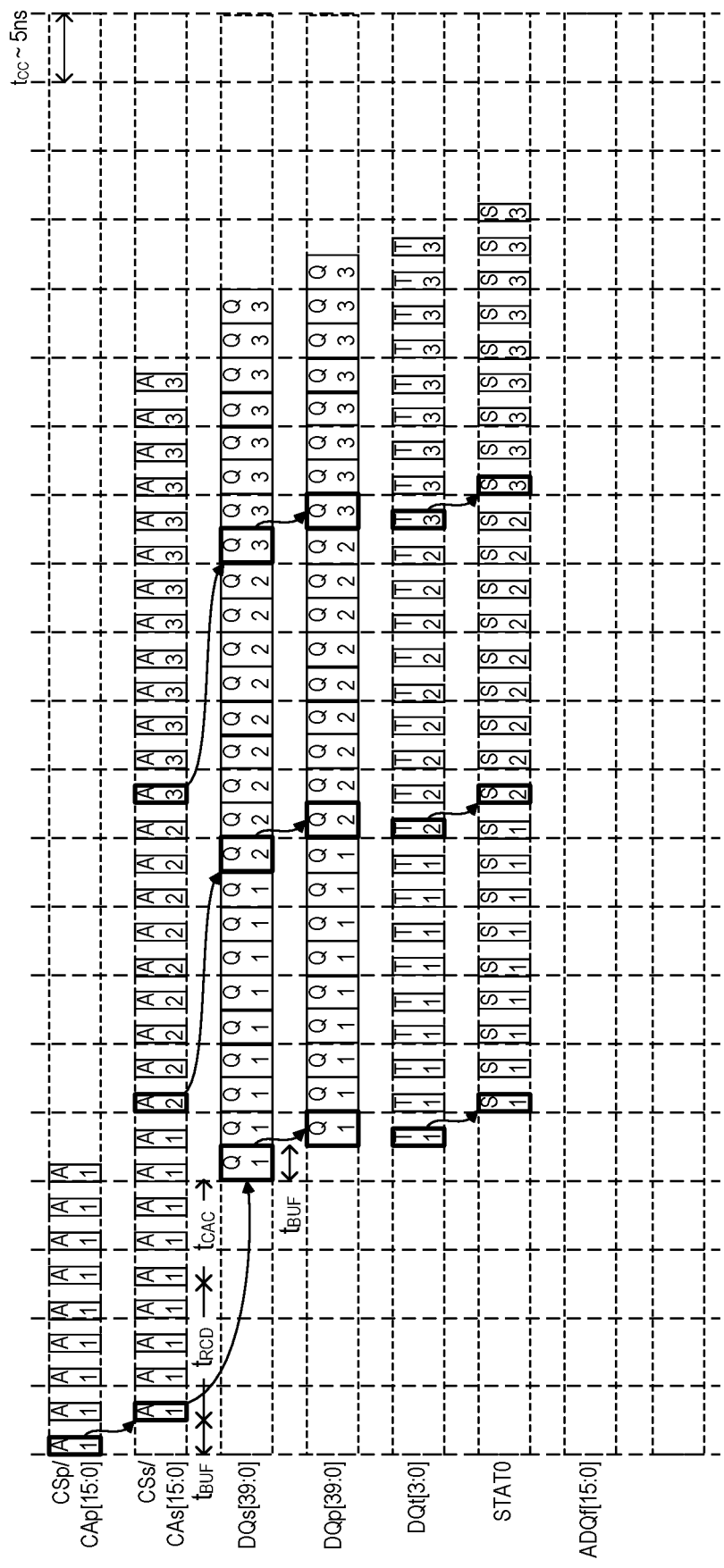
FIG. 6 is a timing diagram illustrating a direct-cache miss/multi-set-cache hit (MissD/HitM) in accordance with one embodiment.

FIG. 6 is a timing diagram illustrating a direct-cache miss/multi-set-cache hit (MissD/HitM) in accordance with one embodiment. Beginning at the far left, controller 110 issues the read request highlighted using a bold border on links CSp/CAp[15:0]. Module controller 118(0) buffers these command and address signals and conveys them to DRAM address space 330 via multiplexer 315 and secondary links CSs/CAs after a buffer delay $t_{BUF}$. DRAM address space 330 then delivers the contents of the requested cache line to secondary data links DQs[39:0] after the sum of a row-to-column read delay $t_{RCD}$ and column access time $t_{CAC}$. After another buffer delay $t_{BUF}$, the requested data is conveyed to controller 110 via primary data links DQp[39:0] and the direct tag TagD is presented to module controller 118(0) via link Qt for consideration by tag-comparison logic 305.

If tag-comparison logic 305 identifies a cache hit, module controller 118(0) sends a direct-hit signal HitD to controller 110 to complete the read access. Given the timing in this example, the overall read latency is thus about twenty nanoseconds for a direct-cache hit. For a direct-tag miss, however, module controller 118(0) issues a MissD signal over status links STAT0 and issues a second local read command (bold A2) seeking the cache tags from cache line TagsDM, which is delivered on secondary data links DQs [39:0] (bold Q2). The third and final access for this direct-cache miss/multi-set-cache hit (MissD/HitM) example begins with the third local read command (bold A3). The overall read latency is thus about sixty-five nanoseconds for a multi-set cache hit. The memory transactions represented using signals with relatively thinner boundaries are unrelated transactions that can be interleaved.

Figure 7:
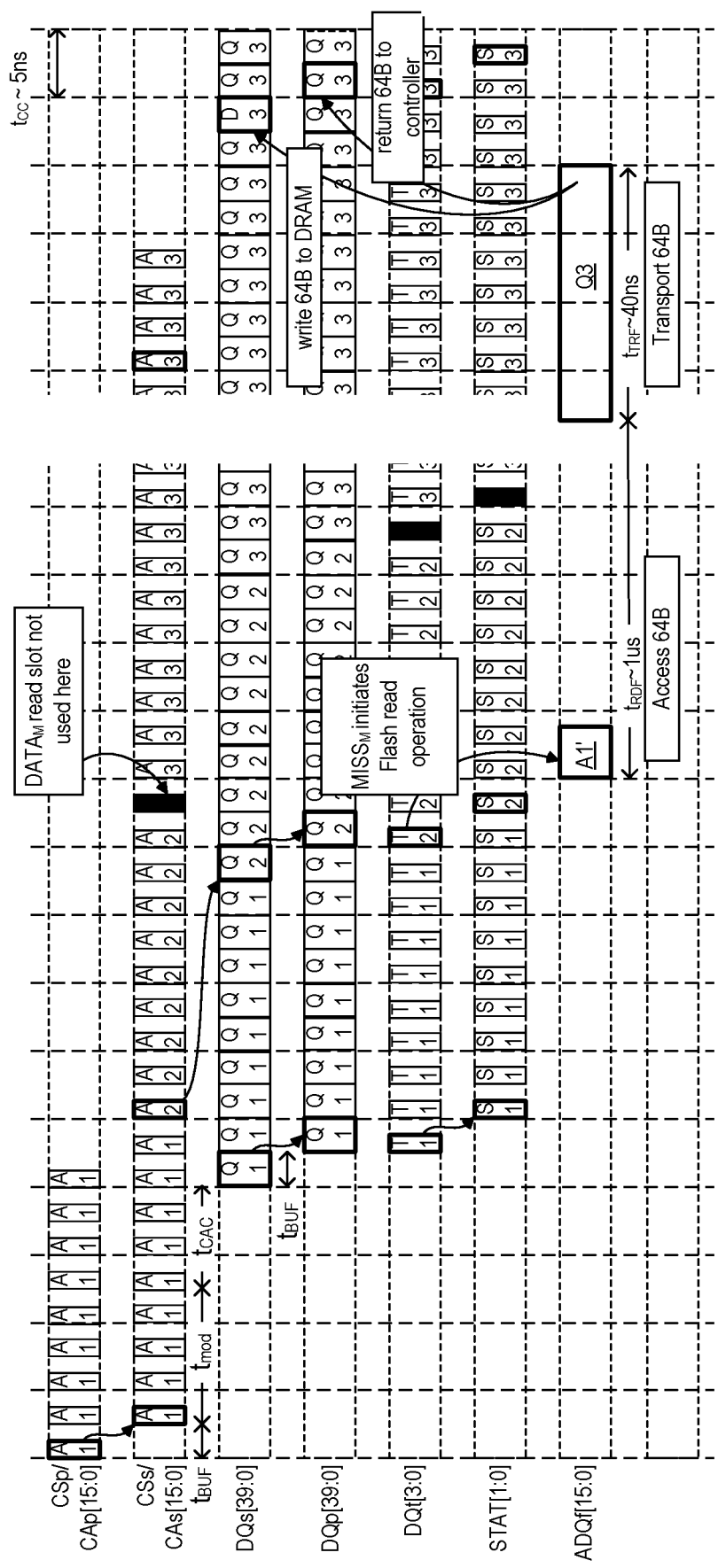
FIG. 7 is a timing diagram a direct-cache miss/multi-set-cache miss (MissD/MissM) in accordance with one embodiment.

FIG. 7 is a timing diagram a direct-cache miss/multi-set-cache miss (MissD/MissM) in accordance with one embodiment. Beginning at the far left, controller 110 issues the read request highlighted using a bold border on links CSp/CAp [15:0]. The flow proceeds as in the example of FIG. 6 until tag-comparison logic 305 identifies a multi-set-cache miss (bold T2). Module controller 118(0) derives flash address $A_{FLASH}$ from the original read request and uses this address to initiate a flash read operation (bold A1' on links ADQf [15:0]). A 64B cache line is Q3 is conveyed to module controller 118(0) links ADQf[15:0] after a flash read delay $t_{RDF}$ and over a transport time $t_{TRF}$. Module controller 118(0) then writes this data to DRAM address space 330 and conveys it to controller 110. Alternatively, module controller 118(0) can simply load the flash data into the DRAM cache to await a subsequent retry from controller 110. In this example, the overall read latency for a cache miss is about 1,100 nanosecond, which is dominated by the 1,000 nanosecond (1 µs) flash read delay $t_{RDF}$.

Figure 8:
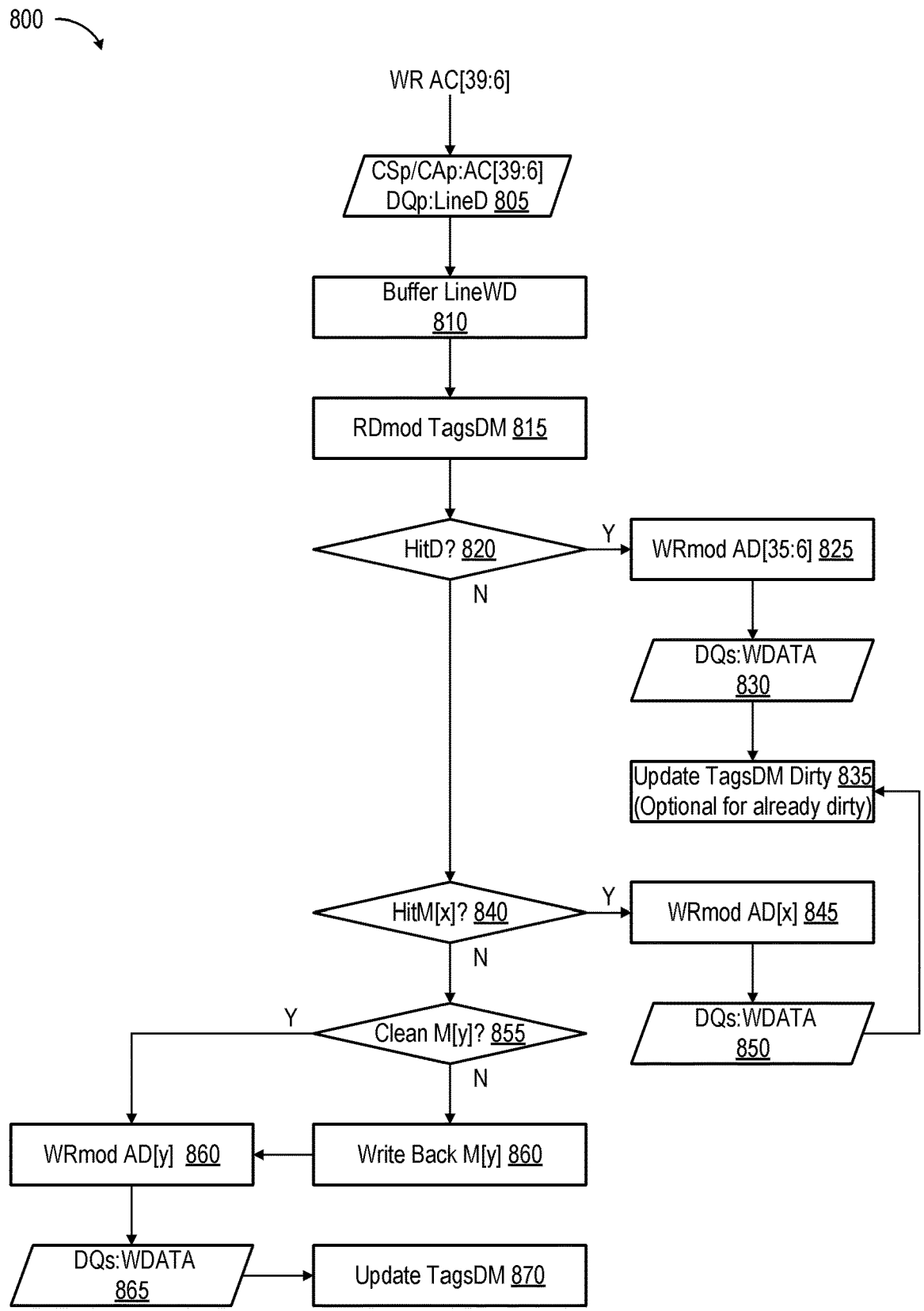
FIG. 8 is a flowchart 800 illustrating a write access to module half 115(0), and refers to signals and signal lines introduced in FIG. 3.

FIG. 8 is a flowchart 800 illustrating a write access to module half 115(0), and refers to signals and signal lines introduced in FIG. 3. A write transaction begins when controller 110 issues 64B of write data LineWD over primary links DQp with a corresponding write request over primary links CSp/CAp (805). DB components 135[4:0] store write data LineWD in buffers 302 (810) at the direction of module controller 118(0).

The write request from controller 110 specifies an address AC[39:6] that may have a corresponding direct or multi-set entry in the DRAM cache. Module controller 118(0) first considers the direct cache, using multiplexer 315 to convey address $A_{MULTI-SET}$ over secondary links CSs/CAs (810). DRAM memory space 330 responsively delivers cache line TagsDM over secondary data links DQs, with each of DQ components 125[4:0] conveying their contribution to tag-comparison logic 305 of module controller 118(0) via links Qt (815). Alternatively, the direct cache line entry can be queried for the corresponding tag TagD, as is done in the read case; however, cache line TagsDM contains both the direct and the multi-set tag entries so that module controller 118(0) can detect both direct and multi-set hits using a single DRAM read access.

If the direct tag for the target write matches bits AC[39: 36], then the cache line under consideration is the target of the write request, a direct-cache hit (820). Module controller 118(0) issues a write command to the direct cache line (825), which causes the write data LineWD and corresponding direct tag to be written to the specified direct cache line from data buffer 302 over secondary links DQs (830). Module controller 118(0) then updates cache line TagsDM to set the dirty bit of the direct cache line under consideration, thereby indicating that the direct cache line entry does not match the corresponding information in flash address space 335 (835). A cache hit to a direct cache line entry thus requires three DRAM accesses, one to read cache line TagsDM, a second to write to the direct cache, and a third to update the direct dirty bit in cache line TagsDM. (This last step is optional if cache line TagsDM already identifies the newly written cache line as dirty.)

Returning to decision 820, if the attempted access to the direct cache is a miss, then module controller 118(0) compares the thirty-one multi-set tags TagMa through TagMe' in cache line TagsDM with the corresponding address bits of the write address under consideration to determine whether any of the multi-set cache entries is the target of the data to be written (840). If one of the multi-set addresses M[x] is a hit, then module controller 118(0) issues a write request to the specified multi-set address (845) and directs the movement of write data LineWD from data buffers 302 in DB components 135[4:0] to the multi-set location in DRAM address space 330 (850). Module controller 118(0) then updates cache line TagsDM to set the dirty bit of the multi-set cache line under consideration (835). A multi-set cache hit thus requires three DRAM accesses, one to read cache line TagsDM, a second to write to the multi-set cache, and a third to update the dirty bit of cache line TagsDM. As in the direct case, this third step is optional if the overwritten cache line entry is already marked dirty.

Returning to decision 840, module controller 118(0) looks for a clean multi-set cache line by reviewing the multi-set dirty bits Ma-Me' (bit ten of each of tag entries Ta-Te') of cache line TagsDM (855). If there are no clean multi-set cache lines, module controller 118(0) writes the data from one of the dirty multi-set cache lines back to flash memory space 335—a flash write back—to create a clean multi-set cache entry (860). When a clean multi-set cache line M[y] is available, module controller 118(0) writes the data from buffers 302 to address AD[y] of the multi-set cache (860 and 865). Module controller 118(0) then updates cache line TagsDM to include the dirty bit and multi-set tag entry for the newly cached data (870). A multi-set cache miss thus requires three DRAM accesses, one to read tagline TagsDM, a second to write a cache line from flash to the multi-set cache, and a third to update the corresponding dirty bit in cache line TagsDM. Write transactions can be interleaved in the manner discussed above in connection with read accesses. The determinations made at 820 and 840 are both based on the incoming address and cache line TagsDM, and can be carried out concurrently. If a requested address is in both the direct and multi-set caches, then module controller 118(0) only updates the direct entry, along with the corresponding tag and dirty bits in cache line TagsDM. The relevant multi-set dirty bit can be cleared to indicate that the multi-set entry is available.

Figure 9:
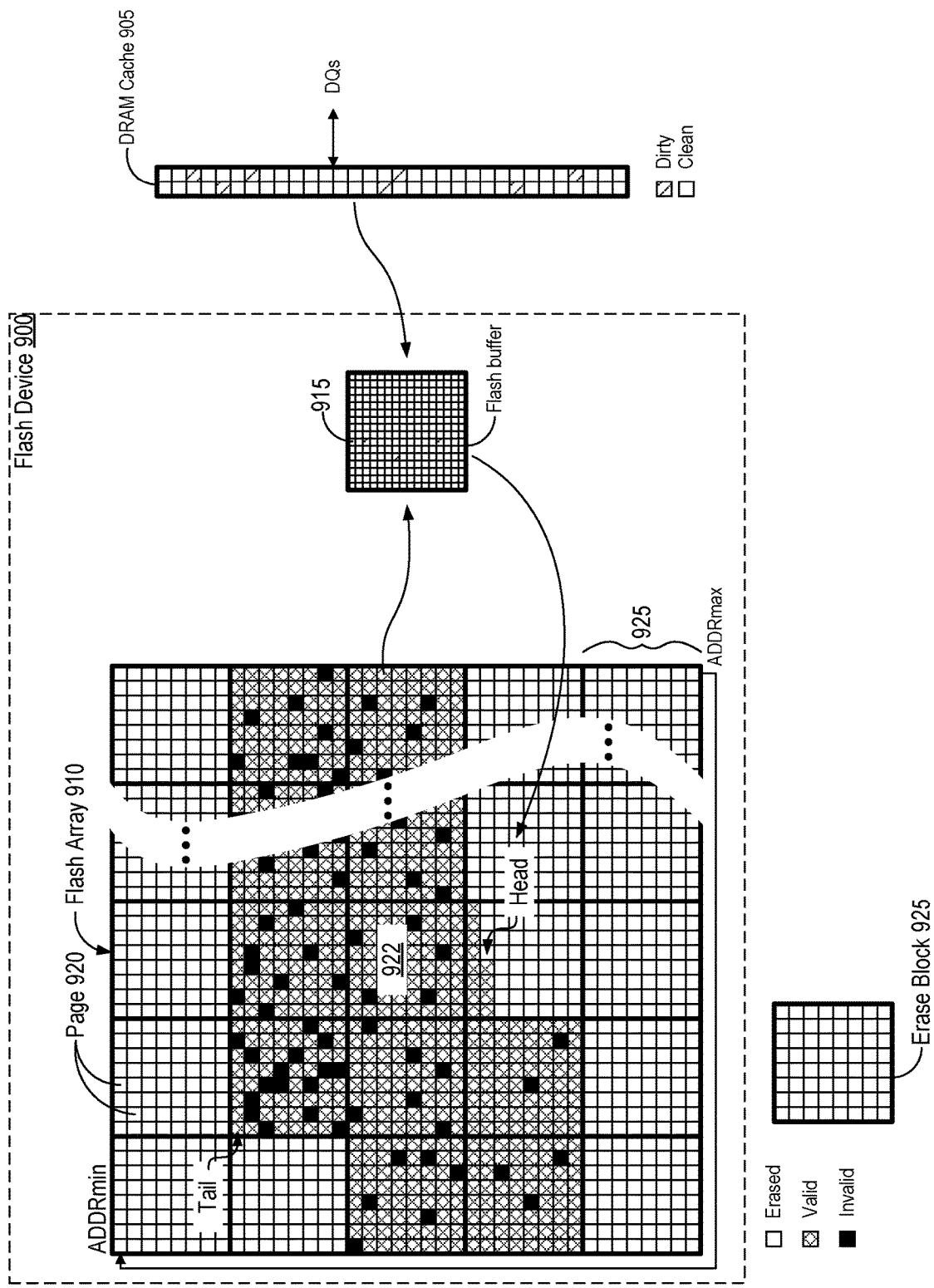
FIG. 9 depicts a single flash device 900 and an associated portion of a DRAM cache 905 in accordance with one embodiment.

FIG. 9 depicts a single flash device 900 and an associated portion of a DRAM cache 905 in accordance with one embodiment. Flash device 900 includes a non-volatile array 910 and a volatile page register 915. Module controller 118(0) maintains one or more data structures in each such flash device 900 in a manner that evenly distributes write operations and minimizes the need to communicate data with devices external to flash device 900. Distributing write operations prolongs the service life of the flash memory, and minimizing external data transfers reduces the demands on flash bus ADQf to improve overall speed performance.

Flash device 900 stores data in terms of "access units," which may be defined as the smallest memory areas handled as a single chunk of data. In the instant example, each nonvolatile access unit is a sixteen kilobyte (16 KB) page 920, and each page stores 256 64B cache lines. Reads and writes to flash array 910 are performed one page at a time. Erasures are carried out on 64-page erase blocks 925. Flash array 910 is therefore divided into erase blocks 925, sometimes called "erase units," each of which is divided into pages 920. A page 920, once written to, cannot be overwritten until the entire corresponding erase block 925 is erased. While shown as a 5×5 array, a practical flash device will have e.g. on the order of a million erase blocks 925.

Pages 920 are marked as erased, valid, or invalid in tables maintained in DRAM by module controller 118(0). Erased pages 920 are empty, ready to receive write data. Valid pages 920 include data that accurately reflects the information for the associated physical page address, or that or are associated with a DRAM cache line entry that contains such data. Pages 920 are marked "invalid" when their local and cached data entries are moved to a new page to allow entries to be effectively overwritten. This movement is directed by controller 118(0), which maintains tables in DRAM that map physical addresses to flash addresses.

Flash array 910 extends between a minimum address ADDRmin (upper left) and a maximum address ADDRmax (lower right), and includes a page array 922 of contiguous valid and invalid page entries. Page array 922 is a data structure that module controller 118(0) maintains between a head pointer Head and a tail pointer Tail, both of which are maintained in registers (not shown) within module controller 118(0). Head pointer Head points to an address of the next empty one of flash pages 920 to receive data writes. Tail pointer Tail points to the one of pages 920 storing the eldest data entry, which is to say the data entry that was written least recently. The number of invalid flash pages 920 in each erase block 925 tends to increase over time, so the erase block 925 with the eldest entries thus tends to be among the erase blocks with the most pages marked invalid.

A garbage collection process is triggered when the separation of the head and tail pointers exceeds a threshold. Module controller 118(0) copies each page 920 marked valid in the erase block with the eldest entries to the address marked by head pointer Head, incrementing the head and tail pointers Head and Tail for each transferred page 920, until all the valid pages from the eldest erase block are moved to the head of page array 922. The eldest erase block 925 is then erased and page array 922 shortened by the number of invalid page entries associated with the erased page. The data structure thus snakes through flash array in a manner that, over time, writes to each flash page an equal number of times, maximizing the endurance of flash device 900. A similar data structure is detailed in U.S. Pat. No. 8,745,315 to Frederick A. Ware and Ely K. Tsem.

Volatile page register 915, itself storing a 16 KB page in this embodiment, facilitates the transfer of data to and from flash pages 920. Module controller 118(0) takes advantage of this resource to minimize the flow of data external to flash device 900, thereby freeing data and control bus ADQf to support flash read and write transactions of other flash devices. In the foregoing garbage-collection process, for example, the head and tail of each data structure is located within the same flash device 900; moving page entries from the tail to the head of data structure 922 can thus be accomplished without external data connections.

Module controller 118(0) also uses page register 915 to reduce external data flow during cache write-back operations. If, for example, a write back from cache 905 requires one cache line from DRAM to overwrite a corresponding line of a flash page 920, the unaffected lines of the flash page are read into page register 915, updated with the one new entry from DRAM, and the resulting updated page is written from page register 915 to a new flash page 920 identified by head pointer Head. The old flash page 920 is then marked invalid. In this way, a write back requires data and control bus ADQf to communicate only dirty cache lines from DRAM cache.

Each flash page 920 includes 256 cache lines, and the 1,024 cache lines in flash address space 335 represent four of those pages. Cache line TagsDM includes all the direct and multi-set dirty bits for those four pages, so all the dirty entries for a given flash page 920 can be identified by reading the corresponding cache line TagsDM. For a write-back to a target page 920, module controller 118(0) transfers the 256 lines in the target page to page register 915; reads cache line TagsDM to identify each dirty cache entry; writes the dirty cache lines from DRAM into page register 915 to overwrite the stale data; copies the merged data to the page of page array 922 indicated by head pointer Head; marks the original flash page invalid; and increments head pointer Head. The snaking data structure will thus increase in length until the next garbage-collection process moves the eldest valid entries to the head of the page array and erases the erase block with the eldest entries.

The frequency of garbage collection and the wear life of flash device 900 will depend in part on the number of erase blocks 925 beyond what is required for physical memory. In a module in accordance with one embodiment the ratio of flash device capacity to physical memory space is ten-to-eight (10/8), which leaves a gap between head and tail pointers Head and Tail of up to about 25% of the flash address space. Increasing flash capacity relative to the physical memory space reduces the frequency of garbage collection and consequently increases the life of the flash devices.

Figure 10:
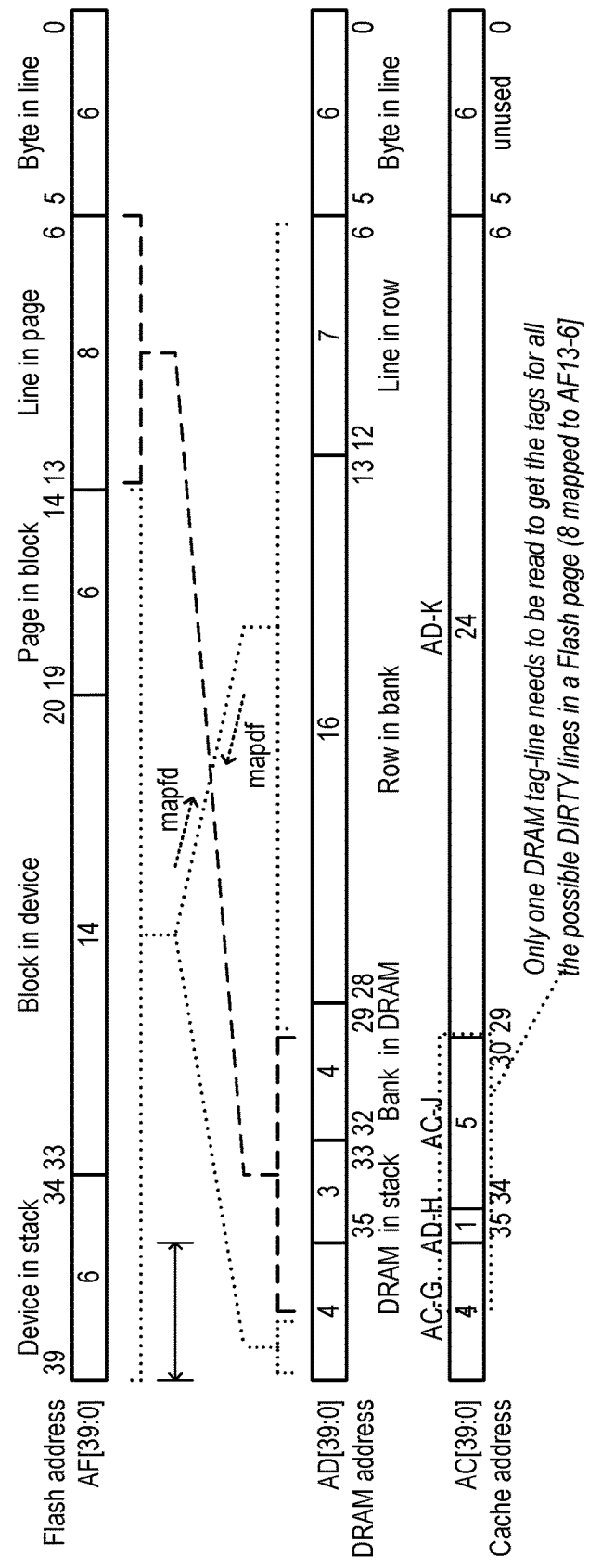
FIG. 10 depicts a form of address mapping 1000 that reduces the time required for module controller 118(0) to read a cache line TagsDM to identify dirty cache line entries for cache write-back operations.

FIG. 10 depicts a form of address mapping 1000 that reduces the time required for module controller 118(0) to read a cache line TagsDM to identify dirty cache line entries for cache write-back operations. Recalling that each cache line TagsDM is 64B, or 640b, this information can be read most quickly if distributed across all ten DRAM components 130D of slices 125[4:0] to be accessed simultaneously and in parallel responsive to the same read request. To accomplish this, flash page addresses are mapped to DRAM line addresses. Module controller 118(0) can thus use the flash page address of the write-back target to read from the same row and line of ten DRAM devices to retrieve the requisite cache line TagsDM. The direct and multi-set dirty bits for an entire flash page can thus be read using a single DRAM read transaction.

Figure 11:
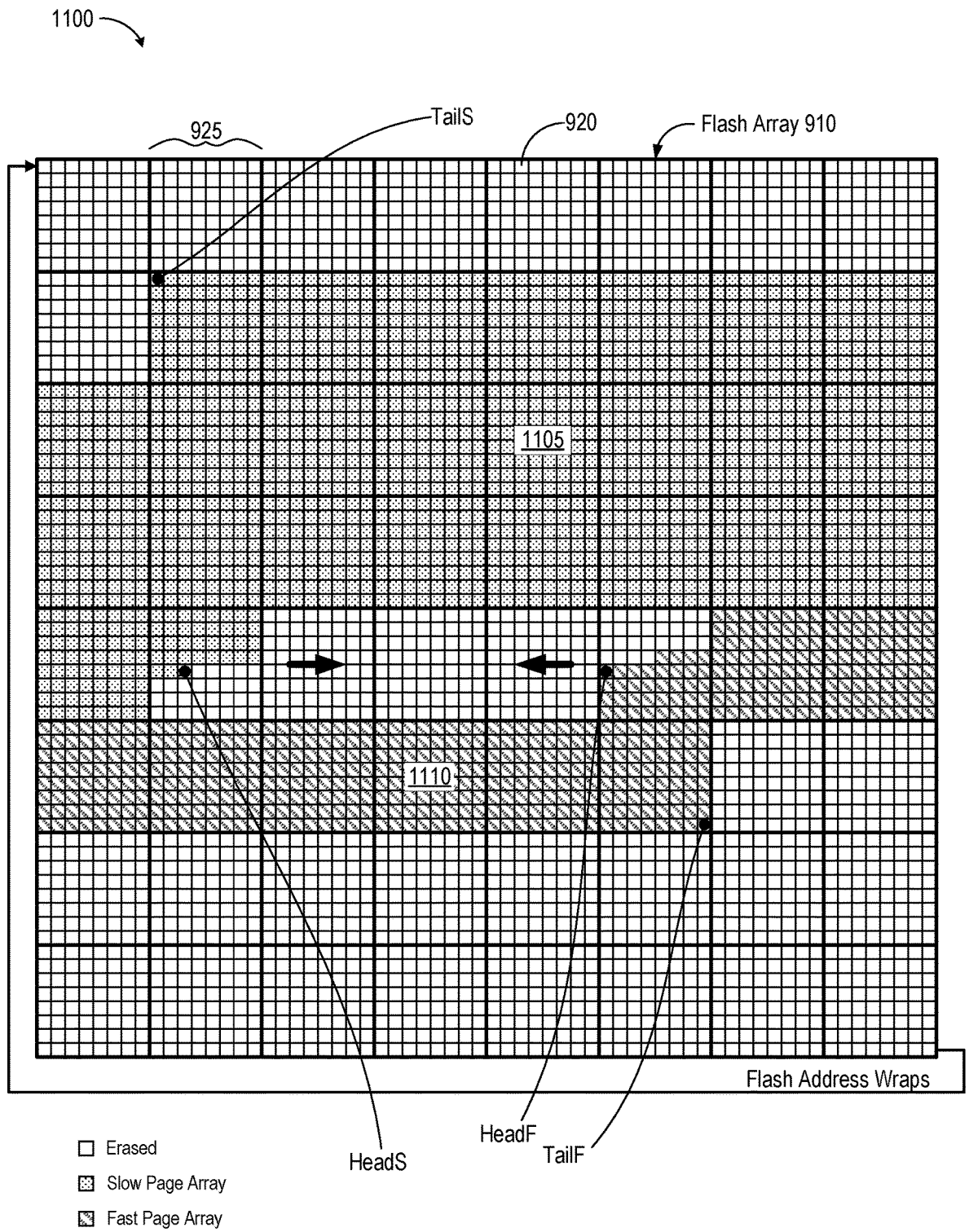
FIG. 11 depicts a flash device 1100 in accordance with an embodiment in which module controller 118(0) manages two data structures that each work their way through flash memory simultaneously.

FIG. 11 depicts a flash device 1100 in accordance with an embodiment in which module controller 118(0) manages two data structures that each work their way through flash memory simultaneously. A relatively long page array 1105 extends between flash addresses indicated by tail and head pointers TailS and HeadS and a relatively short page array 1110 extends between flash addresses indicated by tail and head pointers TailF and HeadF. Module controller 118(0) maintains these and other pointers for each flash device 900. For each write back to flash device 1100, the entries from the source page are written to the page address specified by either of head pointers HeadS or HeadF according to the number of dirty cache lines in the source page. Relatively dirty pages are written to pointer HeadF, whereas relatively clean pages are written to pointer HeadS.

Due to the principle of cache locality, relatively clean pages tend to accumulate writes more slowly than relatively dirty pages. The erase blocks 925 of page array 1105 are thus expected to accumulate invalid page entries more slowly than the erase blocks 925 of page array 1110. Slow page array 1105 is therefore maintained to be longer than fast data structure 1110 so that garbage collection tends to move pages from erase blocks 925 with relatively high percentages of invalid page entries. The threshold number of dirty lines for selecting between the heads of the slow and fast page arrays 1105 and 1110 and the relative sizes of the page arrays can be selected to maximize the average number of invalid page entries for recovered flash pages.

Figure 12:
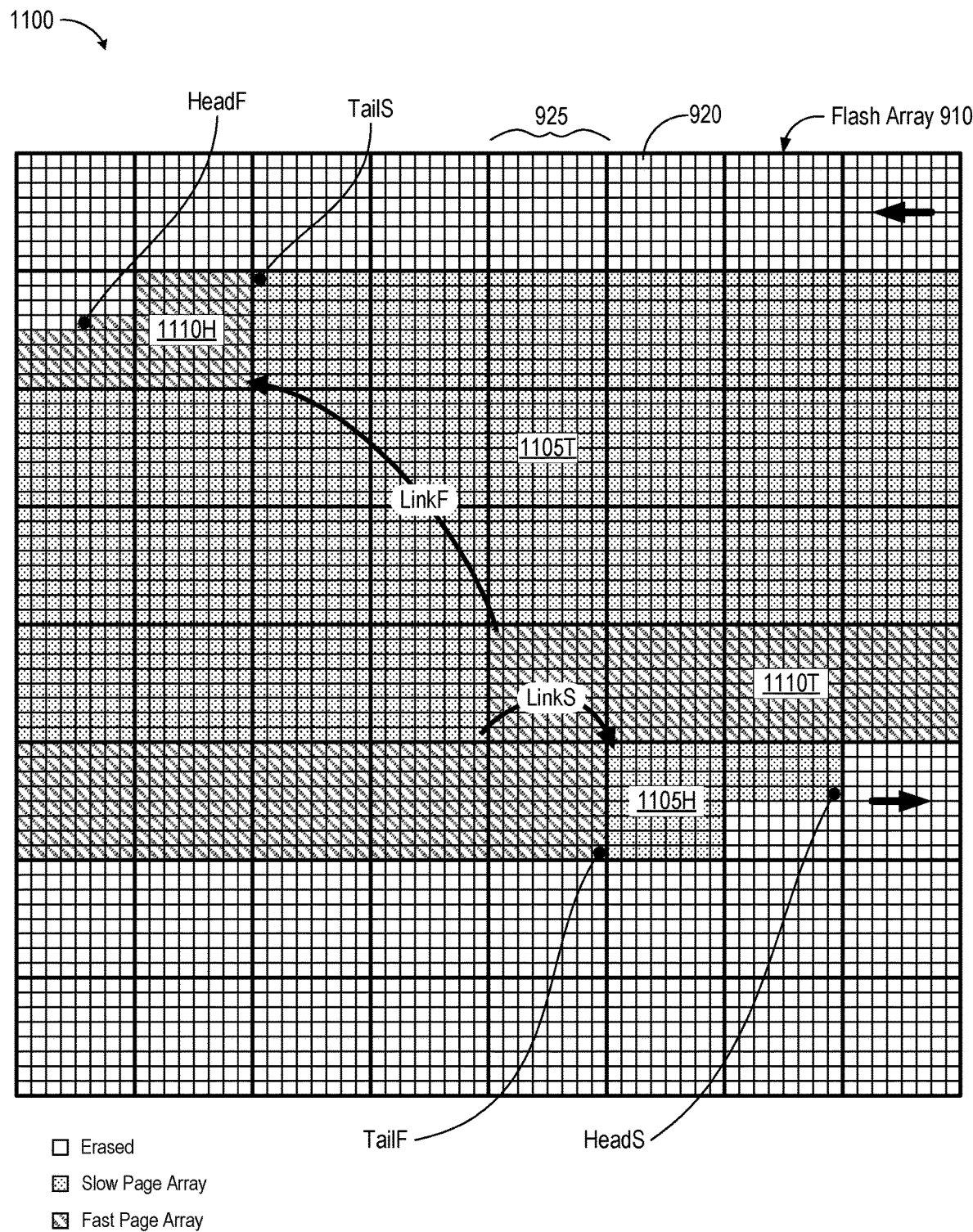
FIG. 12 depicts flash device 1100 of FIG. 11 at a time when slow and fast page arrays 1105 and 1110 have each advanced in their respective directions relative to the example of FIG. 11.

FIG. 12 depicts flash device 1100 of FIG. 11 at a time when slow and fast page arrays 1105 and 1110 have each advanced in their respective directions relative to the example of FIG. 11. Page arrays 1105 and 1110 share the same address range in the same flash device in this embodiment, and therefore interfere with one another over time. This interference occurs as head-on collisions in this embodiment in which slow and fast page arrays 1105 and 1110 move in opposite directions. Each page array is divided into two parts in this example, with slow page array 1105 divided into head and tail portions 1105H and 1105T and fast page array 1110 divided into head and tail portions 1110H and 1110T. Module controller 118(0) maintains state information for flash array 910, depicted here as fast and slow links LinkF and LinkS, that allows the data structures to jump through and around one another.

Figure 13:
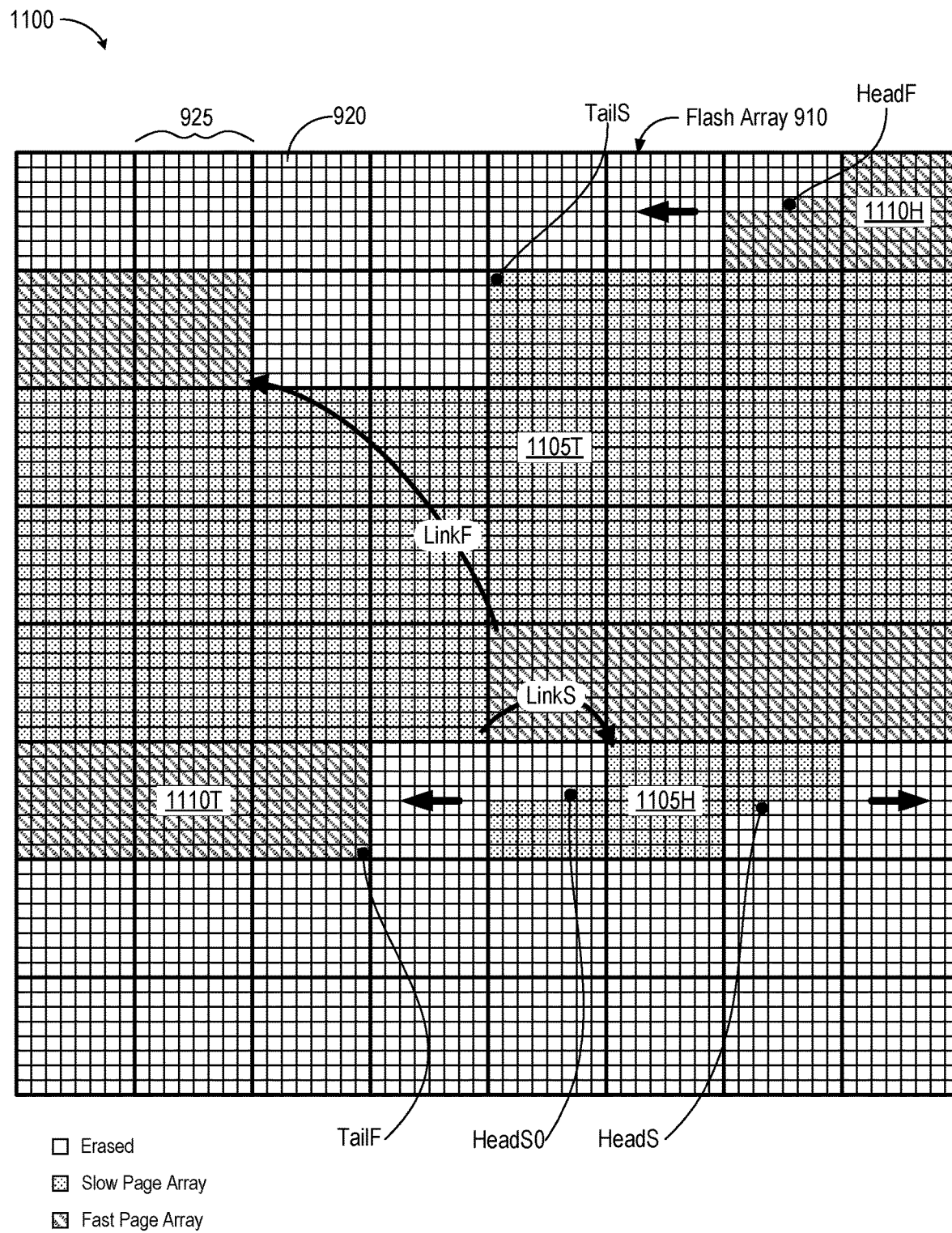
FIG. 13 depicts flash device 1100 of FIGS. 11 and 12 at a time when slow and fast page arrays 1105 and 1110 have each advanced relative to the example of FIG. 12.

FIG. 13 depicts flash device 1100 of FIGS. 11 and 12 at a time when slow and fast page arrays 1105 and 1110 have each advanced relative to the example of FIG. 12. Garbage collection has advanced tail pointer TailF of fast page array 1110 to open a gap of erased pages between the tail portion 1110T of the fast page array and the head portion 1105H of the slow page array. When this happens, module controller 118(0) freezes head pointer HeadS for slow page array 1105 and begins maintaining a second head pointer HeadS0 that increments in the opposite direction to fill the gap. Once the gap is filled, module controller 118(0) returns to writing to head pointer HeadS. The size of the gap is proportional to the length of fast page array 1110. In an embodiment in which the number of erase blocks 925 is about 25% greater than what is required for physical memory, fast page array 1110 is maintained to be about one-sixteenth the length of slow page array 1105.

If the gap becomes too large, or remains open for too long, module controller 118(0) can move the eldest entries from either or both of the fast or slow page arrays 1105 and 1110 until the gap is filled. Fast page array 1110 can likewise be segmented and reformed. Module controller 118(0) thus maintains each of slow and fast page arrays 1105 and 1110 as either a contiguous range of addresses, at times wrapping around, or two address sub-ranges. Other embodiments allow fragmentation into more subranges.

Figure 14:
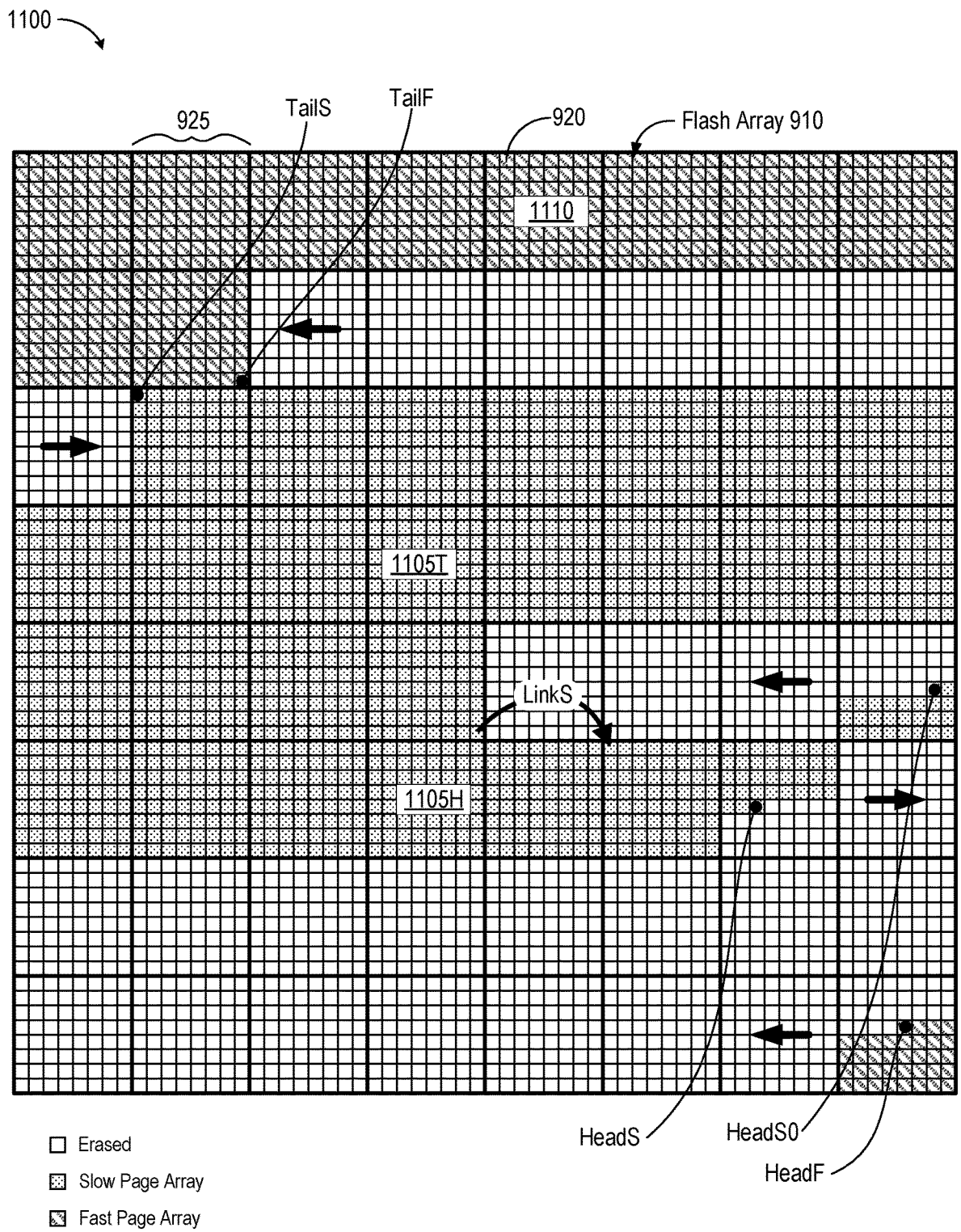
FIG. 14 depicts flash device 1100 of FIGS. 11-13 at a time when fast page array 1110 is reformed and a subrange 1105H at the head to slow page array 1105 is advancing backwards to fill the gap left by fast page array 1110.

FIG. 14 depicts flash device 1100 of FIGS. 11-13 at a time when fast page array 1110 is reformed and a subrange 1105H at the head to slow page array 1105 is advancing backwards to fill the gap left by fast page array 1110.

While the subject matter has been described in connection with specific embodiments, other embodiments are also envisioned. Other variations will be evident to those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A memory system comprising:
    erase blocks of addressable nonvolatile access units, each access unit to store a data entry at a corresponding address;
    a first data structure of a first subset of the data entries stored in the access units of a first contiguous range of the addresses defined between a first head address and a first tail address;
    a second data structure of a second subset of the data entries stored in the access units of a second contiguous range of the addresses defined between a second head address and a second tail address; and
    a controller having a first head pointer to store the first head address, a first tail pointer to store the first tail address, a second head pointer to store the second head address, and a second tail pointer to store the second tail address;
    the controller to move valid ones of the data entries from the first tail address to the first head address and from the second tail address to the second head address;
    wherein the erase blocks are instantiated on a memory device with a volatile register, and wherein the controller moves the valid ones of the data entries from the first tail address to the first head address via the volatile register.

2. The memory system of claim 1, wherein the first head address is lower than the first tail address and the second head address is higher than the second tail address.

3. The memory system of claim 1, wherein the controller moves the valid ones of the data entries from the second tail address to the second head address via the volatile register.

4. The memory system of claim 1, wherein the first tail pointer points to the erase block with the eldest data entries in the first data structure and the second tail pointer points to the erase block with the eldest data entries in the second data structure.

5. The memory system of claim 1, wherein the first tail pointer points to an access unit in one of the erase blocks, and wherein the controller moves all of the valid ones of the data entries in the one of the erase blocks to the first head address, changing the first head pointer for each of the valid ones of the data entries, before erasing the one of the erase blocks.

6. The memory system of claim 5, wherein the controller moves all of the valid ones of the data entries in the one of the erase blocks triggered by a separation between the first head address and the first tail address.

7. The memory system of claim 6, wherein the second tail pointer points to an access unit in a second one of the erase blocks, and wherein the controller moves all of the valid ones of the data entries in the second one of the erase blocks to the second head address, changing the second head pointer for each of the valid ones of the data entries in the second one of the erase blocks, before erasing the second one of the erase blocks.

8. The memory system of claim 7, wherein the controller moves all the valid ones of the data entries in the second one of the erase blocks triggered by a separation between the second head address and the second tail address.

9. The memory system of claim 8, wherein the separation between the first head address and the first tail address is less than the separation between the second head address and the second tail address.

10. The memory system of claim 1, wherein the volatile register stores source pages of data, each source page of data having a number of dirty cache lines, and wherein the memory controller writes each source page of data to one of the first data and second data structures responsive to the number of dirty cache lines in the source page of data.

11. A memory-access method for a memory system with erase blocks of addressable nonvolatile access units, each access unit to store a data entry at a corresponding address, the method comprising:
    maintaining a first data structure of a first subset of the data entries stored in the access units of a first contiguous range of the addresses defined between a first head address and a first tail address;
    maintaining a second data structure of a second subset of the data entries stored in the access units of a second contiguous range of the addresses defined between a second head address and a second tail address; and
    initiating a garbage-collection process that moves valid ones of the data entries from the one of the erase blocks with the access unit of the first tail address to the first head address before erasing the one of the erase blocks;
    wherein the memory system comprises a volatile register instantiated on a memory device with the erase blocks, the method moving the valid data entries via the volatile register.

12. The method of claim 11, further comprising initiating a second garbage-collection process that moves valid ones of the data entries from one of the erase blocks with the access unit of the second tail address to the second head address.

13. The method of claim 11, wherein the first head address is lower than the first tail address and the second head address is higher than the second tail address.

14. The method of claim 11, wherein the first tail address references the erase block with the eldest data entries in the first data structure and the second tail address references the erase block with the eldest data entries in the second data structure.

15. The method of claim 11, wherein the first tail address references an access unit in one of the erase blocks, the method comprising moving all of the valid ones of the data entries in the one of the erase blocks to the first head address, changing the first head address for each of the valid ones of the data entries, before erasing the one of the erase blocks.

16. The method of claim 15, wherein the moving of all of the valid ones of the data entries is triggered by a separation between the first head address and the first tail address.

17. The memory access method of claim 11, the memory system further comprising writing source pages of data from the volatile register to one of the first data structure and the second data structure responsive to a number of dirty cache lines in the source page of data.

18. A memory system comprising:

erase blocks of addressable nonvolatile access units, each access unit to store a data entry at a corresponding address;

a first data structure of a first subset of the data entries stored in the access units of a first contiguous range of the addresses defined between a first head address and a first tail address;

a second data structure of a second subset of the data entries stored in the access units of a second contiguous range of the addresses defined between a second head address and a second tail address; and means for moving valid ones of the data entries from a first of the erase blocks of the first data structure to the first head address and successive first head addresses, moving valid ones of the data entries from a second of the erase blocks of the second data structure to the second head address and successive second head addresses, and moving source pages of data to one of the first data structure and the second data structure responsive to a number of dirty lines in each of the source pages.

19. The memory system of claim 18, wherein the successive first head addresses succeed incrementally and the successive second head addresses succeed decrementally.

20. The memory system of claim 18, wherein the moving of the valid ones of the data entries from the first of the erase blocks is triggered by a separation between the first tail address and the first head address.

\* \* \* \* \*